(12) United States Patent
Beach

(10) Patent No.: US 7,417,267 B2
(45) Date of Patent: Aug. 26, 2008

(54) NON-PLANAR III-NITRIDE POWER DEVICE HAVING A LATERAL CONDUCTION PATH

(75) Inventor: Robert Beach, Altadena, CA (US)

(73) Assignee: International Rectifier Corporation, El Segundo, CA (US)

(*) Notice: Subject to any disclaimer, the term of this patent is extended or adjusted under 35 U.S.C. 154(b) by 38 days.

(21) Appl. No.: 11/232,646

(22) Filed: Sep. 22, 2005

(65) Prior Publication Data

US 2006/0065912 A1    Mar. 30, 2006

Related U.S. Application Data

(60) Provisional application No. 60/612,756, filed on Sep. 24, 2004.

(51) Int. Cl.
*H01L 31/00* (2006.01)
(52) U.S. Cl. ............... 257/192; 257/194; 257/E21.403
(58) Field of Classification Search ................ 257/194, 257/E29.246, E29.253, 192, 195, E21.403
See application file for complete search history.

(56) References Cited

U.S. PATENT DOCUMENTS

| | | | | |
|---|---|---|---|---|
| 4,704,622 A | * | 11/1987 | Capasso et al. ............... 257/25 |
| 5,266,506 A | * | 11/1993 | Green, Jr. .................... 438/172 |
| 5,436,474 A | * | 7/1995 | Banerjee et al. .............. 257/194 |
| 5,892,247 A | * | 4/1999 | Oowaki et al. ............... 257/194 |
| 5,989,947 A | * | 11/1999 | Dilger et al. ................. 438/172 |
| 6,072,197 A | * | 6/2000 | Horino et al. ................ 257/103 |
| 2002/0086494 A1 | * | 7/2002 | Park et al. .................... 438/406 |
| 2002/0182791 A1 | * | 12/2002 | Yoshida ....................... 438/194 |
| 2004/0157355 A1 | | 8/2004 | Kachi et al. |
| 2005/0145883 A1 | * | 7/2005 | Beach et al. ................. 257/194 |
| 2006/0281284 A1 | * | 12/2006 | Harris et al. ................. 438/478 |

OTHER PUBLICATIONS

M.A Kahn et al. "Recent Advances in III-V Nitride Electron Devices," Electron Devices Meeting, 1996., International, Dec. 8-11, 1996, San Francisco, CA, U.S.A.*

* cited by examiner

*Primary Examiner*—Bradley W. Baumeister
*Assistant Examiner*—Matthew L Reames
(74) *Attorney, Agent, or Firm*—Ostrolenk, Faber, Gerb & Soffen, LLP

(57) ABSTRACT

A III-nitride power semiconductor device that includes a heterojunction body with a sloping portion, a first power electrode, a second power electrode and a gate over the sloping portion of the heterojunction to control the conduction of current between the first power electrode and the second power electrode of the HI-nitride power semiconductor device.

17 Claims, 8 Drawing Sheets

US 7,417,267 B2

NON-PLANAR III-NITRIDE POWER DEVICE HAVING A LATERAL CONDUCTION PATH

RELATED APPLICATION

This application is based on and claims benefit of U.S. Provisional Application No. 60/612,756, filed on Sep. 24, 2004, entitled Non-Planar FET Device with Lateral Conduction in III-Nitride Material System With Threshold Voltage Control, to which a claim of priority is hereby made and the disclosure of which is incorporated by reference.

FIELD OF INVENTION

The present application relates to a power semiconductor device, and more particularly to a III-Nitride power semiconductor device.

BACKGROUND OF THE INVENTION

III-Nitride power semiconductor devices are commercially desirable due to their high band gap and high current carrying capabilities.

FIG. 1 illustrates an example of a typical high electron mobility transistor (HEMT), which is formed using a heterojunction III-nitride-based semiconductor die. Specifically, a HEMT according to the prior art includes a first III-nitride semiconductor body 10, which may be composed of, for example, undoped GaN, and a second III-Nitride semiconductor body 12, which may be composed of, for example, N-type AlGaN, disposed over first semiconductor body 10. First semiconductor body 10 may be formed over a transition body 8 composed, for example, of AlN, which is itself formed over substrate 6. Substrate 6 is preferably formed from Si, but may be formed from SiC, Sapphire, or the like. Alternatively, substrate 6 may be formed from a bulk III-Nitride semiconductor (e.g. bulk GaN) which is compatible with first semiconductor body 10, in which case transition body 8 may be eliminated.

As is well known, the heterojunction of first semiconductor body 10 and second semiconductor body 12 results in the formation of a conductive region usually referred to as a two dimensional electron gas or 2DEG 14. Current may be conducted between a first ohmic contact 16 (which is ohmically coupled to second semiconductor body 12), and second ohmic contact 18 (which is also ohmically coupled to second semiconductor body 12) through 2DEG 14.

A conventional HEMT, such as the one seen in FIG. 1, is a normally ON device. In many applications it is desirable to turn the device off or have a normally OFF device. Thus, a gate electrode 20 may be disposed between first ohmic contact 16 and second ohmic contact 18. Gate structure 20 includes at least a gate electrode which may be electrically insulated by gate insulation 21 and thus capacitively couple to second semiconductor body 12. The application of an appropriate voltage to gate electrode 20 causes the interruption of 2DEG 14 thereby turning the device OFF. Thus, to operate a conventional HEMT as a normally OFF device requires the continued application of a voltage to gate electrode 20, which is not desirable as it consumes more energy, and may also require a more complicated drive circuitry compared to a normally OFF device.

SUMMARY OF THE INVENTION

A III-nitride power semiconductor device according to the present invention includes a first III-nitride semiconductor body, a second III-nitride semiconductor body over the first III-nitride semiconductor body forming a heterojunction body, the heterojunction body including a first portion, a second portion, and a third portion sloping at an angle between the first portion and the second, whereby the 2DEG resulting from the heterojunction of the two III-nitride semiconductor bodies is interrupted by third sloping portion. A device according to the present invention further includes a first power contact electrically coupled to the first portion of the heterojunction body, a second power contact electrically coupled to the second portion of the heterojunction body, and a gate structure coupled to the third portion of the heterojunction body.

The heterojunction body may be disposed on a substrate. Alternatively, the heterojunction may be disposed over a buffer layer, which in turn is disposed over a substrate.

A device according to the preferred embodiment of the present invention includes a multi-layer stack of III-Nitride materials grown on an appropriate substrate. The stack is preferably fabricated through two separate growth stages.

The first step in the fabrication of a device according to the preferred embodiment of the present invention is the growth of a GaN layer on a suitable substrate. The GaN layer is then etched to obtain a stepped profile. That is, the GaN layer is etched to have two spaced planes connected to one another by a sloping or vertical wall. Thereafter, one or more layers of III-N material are grown over the GaN layer. These layers can consist of various combinations of AlGaInN material stacked to produce at least a conduction region and a confinement layer. An example would be: GaN buffer region to reduce defects generated by the etching; a smaller band gap material, such as InGaN, for the conduction region; a barrier layer, such as AlGaN for the confinement layer and for generating the 2-DEG; an ohmic contact layer, such as N+GaN, InGaN, or a supper-lattice of III-N material, to improve contact resistance with ohmic contacts of the device.

Alternatively, instead of a four layer structure as described above, a simplified structure could consist of merely the growth of an AlGaN layer directly on the etched GaN.

Thereafter, known steps for forming ohmic contacts gate, insulation, gate electrode may be carried out in any desired order.

It should be noted that the angle of the sloping portion is important because it can be used to control the threshold voltage. Specifically, the threshold voltage increases as the sloping portion approaches a vertical orientation. Thus, by selecting the proper angle a device can become normally off (enhancement mode) or it can become a normally on (depletion mode) with a very low threshold voltage.

A device according to the present invention can have a variety of shapes including circle, oval, square, or any other geometry.

DETAILED DESCRIPTION OF THE EMBODIMENTS

Figure 1:
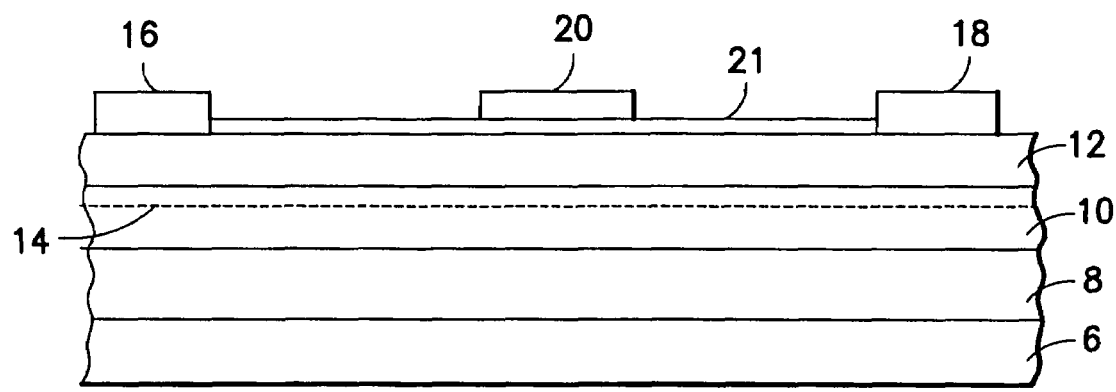
FIG. 1 schematically illustrates a cross-sectional view of a portion of a heterojunction transistor according to the prior art.
Figure 2:
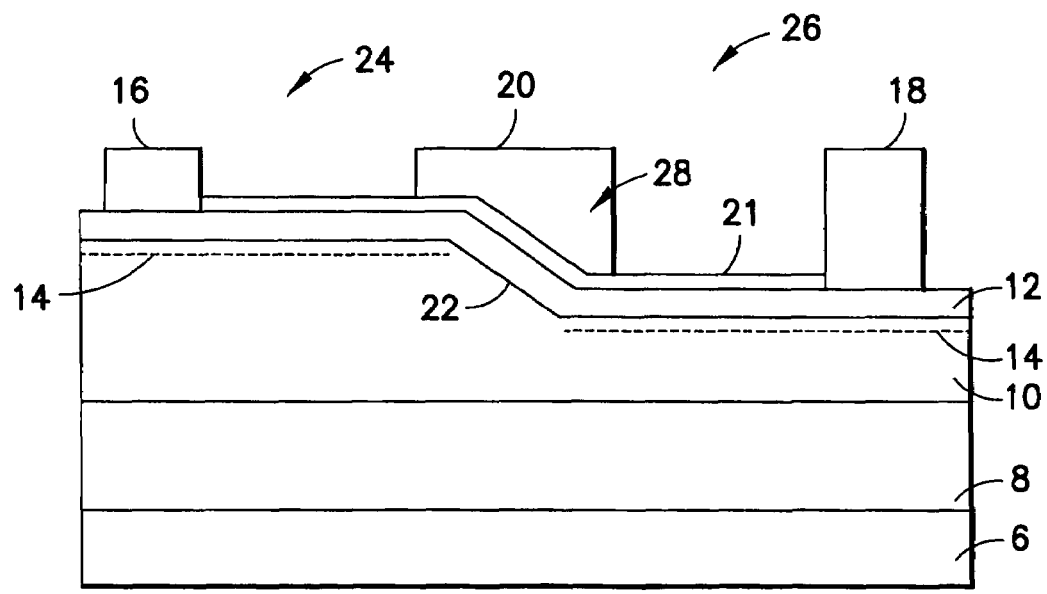
FIG. 2 schematically illustrates a cross-sectional view of a portion of a device according to the first embodiment of the present invention.

Referring first to FIG. 2, a III-nitride power device according to the first embodiment of the present invention includes first III-nitride semiconductor body (first semiconductor body) 10, and second III-nitride semiconductor body (second semiconductor body) 12 formed over first semiconductor body 10. According to the present invention a sloping portion 22 of first semiconductor body 10 slopes from a first plane to a second plane, whereby the heterojunction of first semiconductor body 10 and second semiconductor body 12 includes a first portion 26, a second portion 26, and a third portion 28 sloping downwardly at an angle between first portion 24 and second portion 26 of the heterojunction of first semiconductor body 10 and second semiconductor body 12. Due to the sloping third portion 2DEG 14 is interrupted as schematically illustrated by absence of a broken line representing a 2DEG. That is, the 2DEG between first portion 24 and second portion 26 is interrupted. Thus, a device according to the present invention is normally OFF.

A device according to the present invention includes first ohmic contact 16 ohmically coupled to second semiconductor body 12 at first portion 26 of the heterojunction of first semiconductor body 10 and second semiconductor body 12; second ohmic contact 18 ohmically coupled to second semiconductor body 12 at second portion 24 of the heterojunction of first semiconductor body 10 and second semiconductor body 12; and gate electrode 20 capacitively coupled to at least third portion 28 of the heterojunction of first semiconductor body 10 and second semiconductor body 12 through gate insulation 21 formed, for example, from $Si_3N_4$, $SiO_2$, $Al_2O_3$ or any other suitable gate insulation. It should be noted that as an alternative, gate insulation 21 can be omitted, and instead a gate electrode may be provided that makes schottky contact with second semiconductor body 12. Thus, through the application of an appropriate threshold voltage to the gate electrode of the device, a 2DEG can be restored beneath third portion 28 connecting the 2DEG in first portion 24 and second portion 26 rendering the device ON. The threshold voltage in a device according to the present invention can be selected by selecting an appropriate angle for the slope of third portion 28.

First semiconductor body 10 may be formed from undoped GaN, while second semiconductor body 12 may be formed from AlGaN. Alternatively, first semiconductor body 10 may be formed with AlGaN, and second semiconductor body 12 may be formed with GaN. If GaN is used to form first semiconductor body 10, buffer layer 8 may be formed from AlGaN or any other suitable material. Substrate 6 is preferably made from Si, for economic reasons. However, other substrate materials such as SiC, or sapphire may be used. It should be noted that buffer layer 8 may be omitted if substrate 6 is composed of a material compatible with GaN, such as a substrate formed from bulk GaN, or bulk like GaN.

Figure 3:
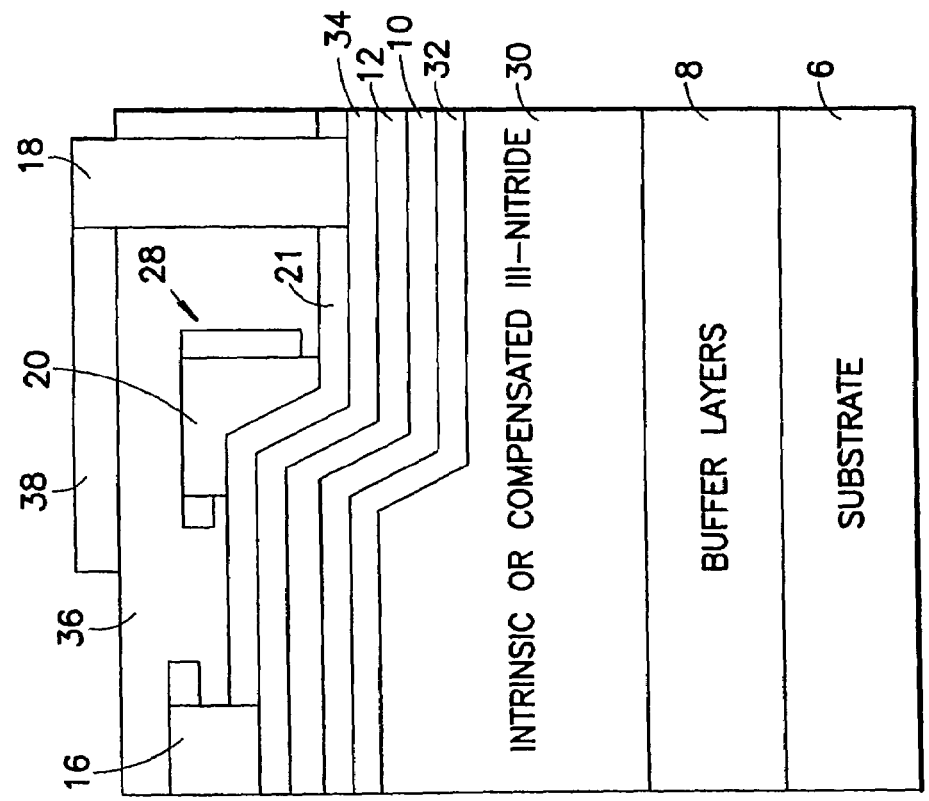
FIG. 3 schematically illustrates a cross-sectional view of a portion of a device according to the second embodiment of the present invention.

A power device according to the second embodiment of the present invention includes further features for enhancing the performance of the device. Referring to FIG. 3, a power device according to the second embodiment of the present invention includes substrate 6, buffer layer 8, base layer 30 disposed on buffer layer 8, another buffer layer 32 disposed over base layer 30, first III-nitride semiconductor body 10 disposed over another buffer layer 32, second III-nitride semiconductor body 12 disposed over first III-nitride semiconductor body 10, ohmic contact layer 34 disposed over second semiconductor body 12, first ohmic contact 16 and second ohmic contact 18, ohmically coupled to ohmic contact layer 34, and gate electrode 20 capacitively coupled to third portion 28 of the heterojunction of first semiconductor body 10 and second semiconductor body 12 through gate insulation 21. A device according to the second embodiment further includes a passivation body 36 and field plate 38.

Figure 4:
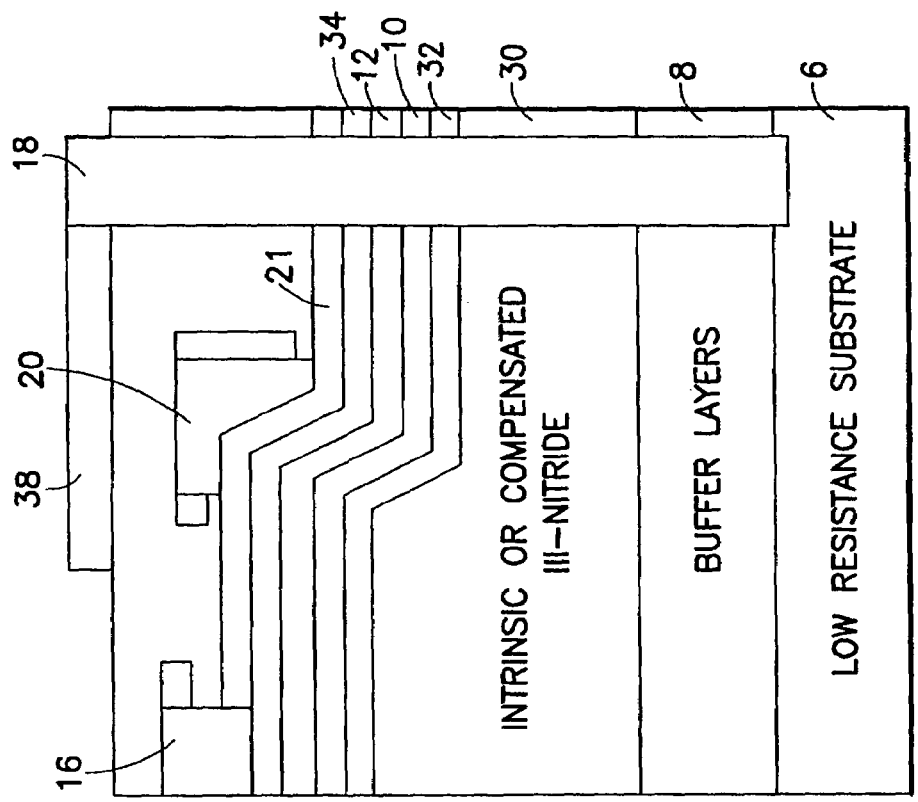
FIG. 4 schematically illustrates a cross-sectional view of a portion of a device according to the third embodiment of the present invention.

Referring next to FIG. 4, second ohmic contact 18 extends and is electrically connected to substrate 6. In other respects, a power device according to the third embodiment of the present invention includes all of the features of a device according to the second embodiment of the present invention.

Figure 5A:
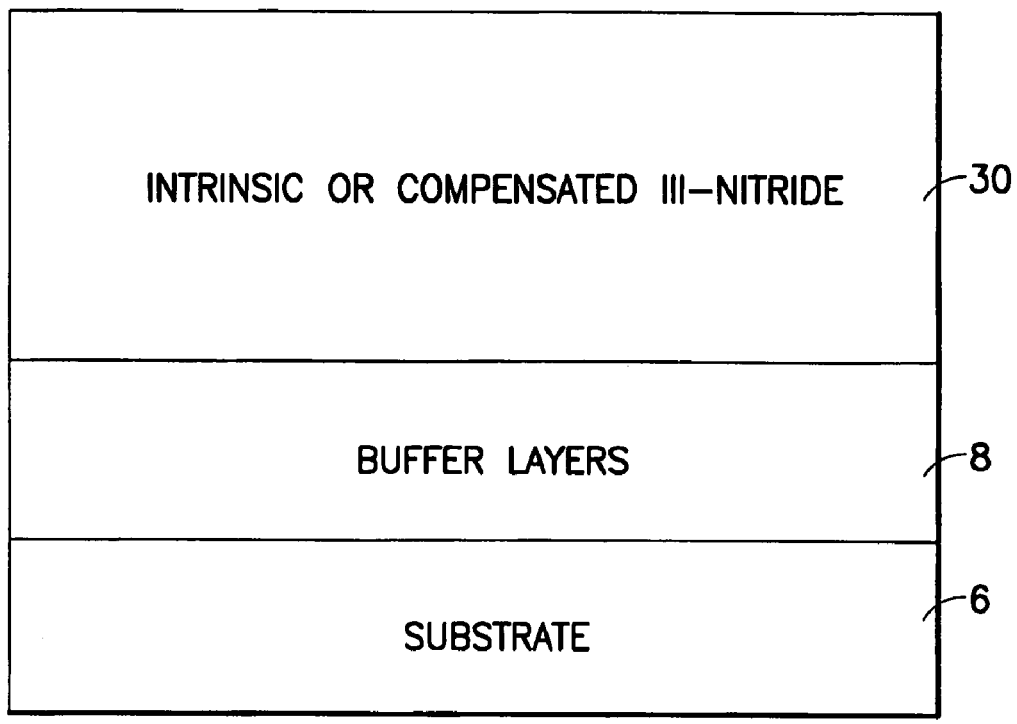
FIGS. 5A-5F schematically illustrate the steps in fabricating a device according to the present invention.
Figure 5B:
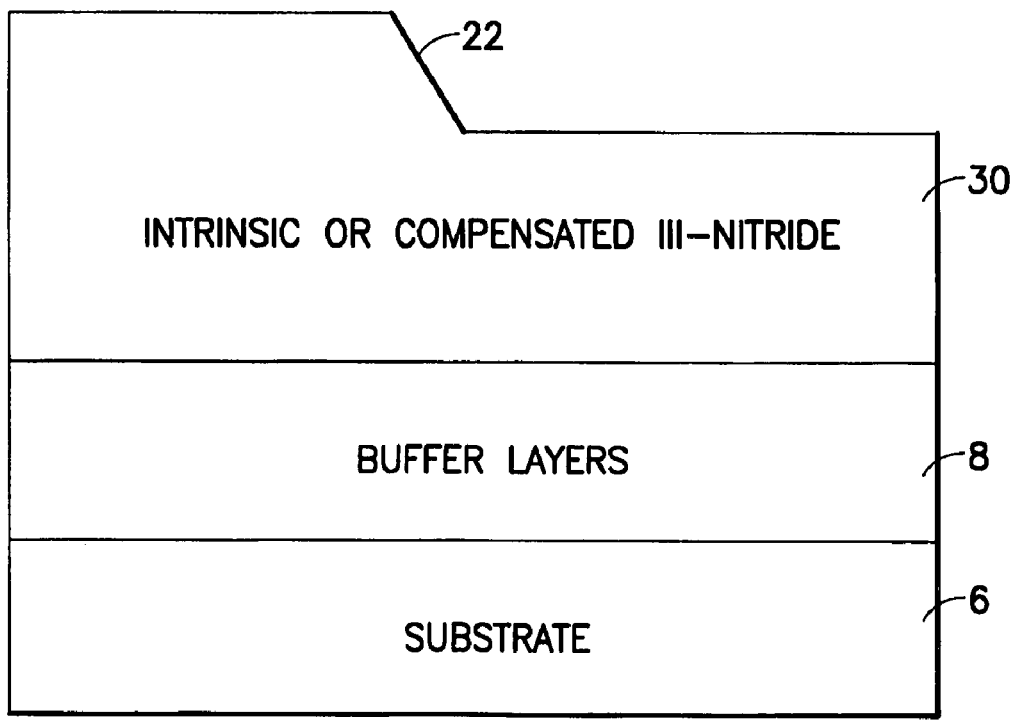

Referring next to FIG. 5A, to fabricate a device according to the present invention a stack including substrate 6, buffer layer 8 and base layer 30 is provided, and base layer 30 is etched to obtain a sloping portion 22 extending between a first plane and a second plane as seen in FIG. 5B.

Figure 5C:
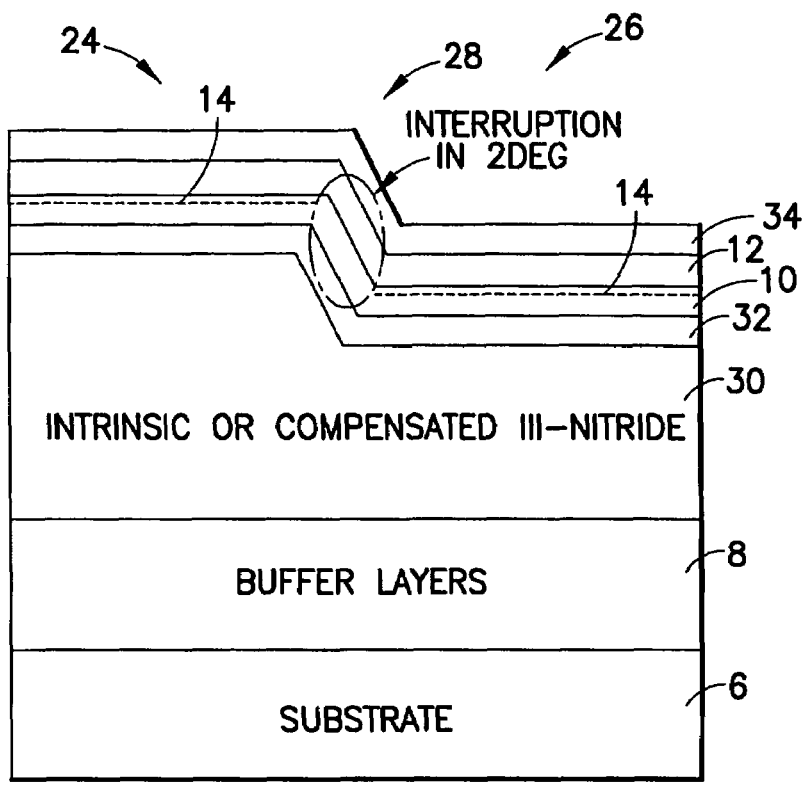

Next, another buffer layer 32, first semiconductor body 10, second semiconductor body 12, and ohmic contact layer 34 are formed in sequence resulting in a structure, such as the one illustrated by FIG. 5C. Note that the structure shown in FIG. 5C includes the features of the present invention namely a heterojunction of a first III-nitride semiconductor body 10 and a second III-nitride semiconductor body 12, having a first portion 24, a second portion 26, a third portion 28 sloping downwardly at an angle between first portion 24 and second portion 26. The angle of the slope of third portion 28 is selected to reduce or interrupt the density of electrons in 2DEG 14 between first portion 24 and second portion 26 of the heterojunction in order to reduce the threshold voltage of a depletion mode device or render the device normally OFF.

Figure 5D:
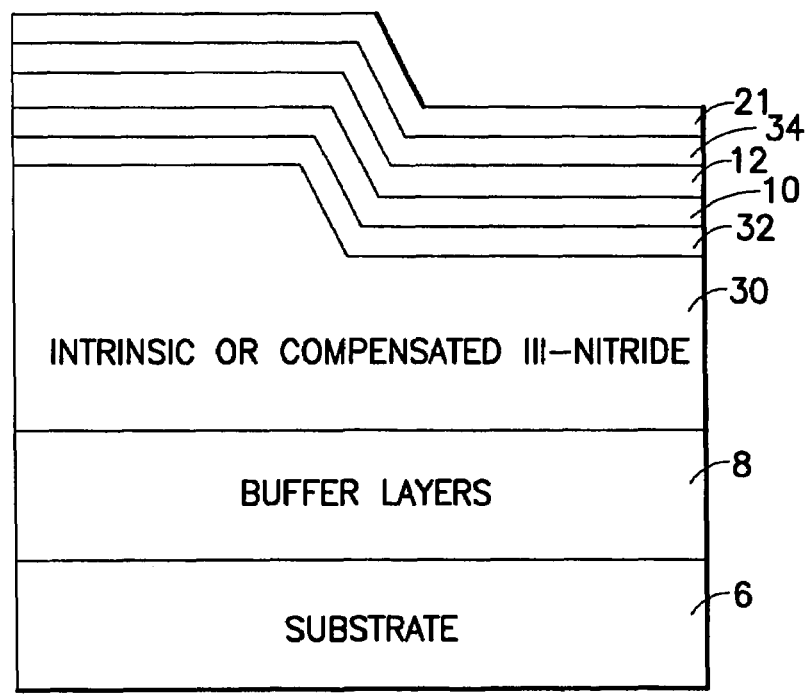
Figure 5E:
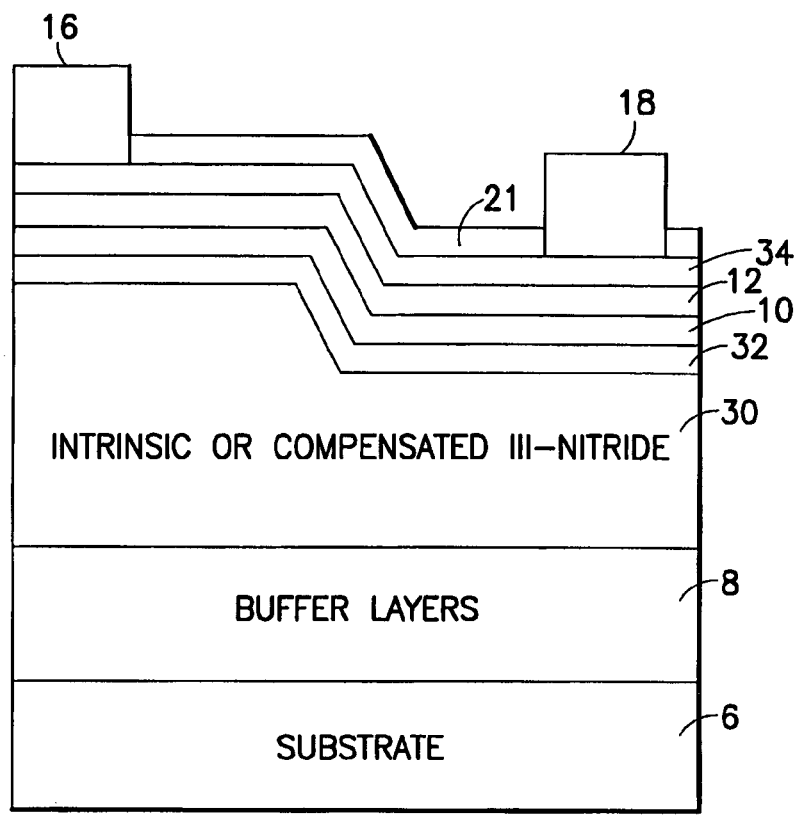

Referring next to FIG. 5D, gate insulation layer 21 is formed over ohmic contact layer 34, and then etched to provide openings reaching ohmic contact layer 34 beneath. Thereafter, first ohmic contact 16 and second ohmic contact 18 are formed in the openings in gate insulation layer 21 to make ohmic contact with ohmic contact layer 34 as illustrated by FIG. 5E. To fabricate a device according to the third embodiment of the present invention, a trench reaching substrate 6 can be formed at the bottom of an opening in gate insulation 21, and one of the ohmic contacts (e.g. second ohmic contact 18) can be formed in the trench reaching at least substrate 6.

Figure 5F:
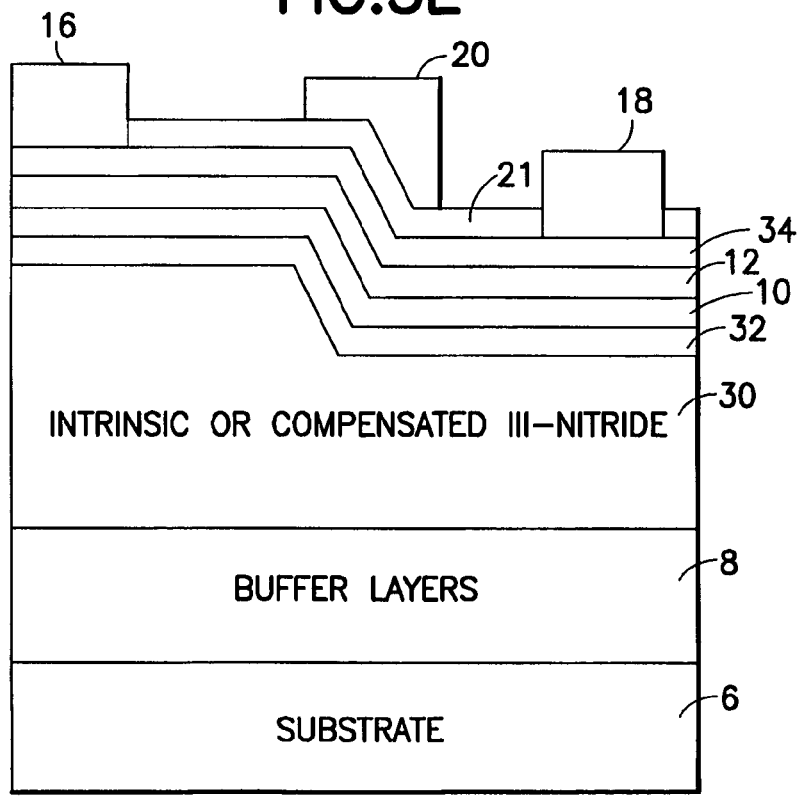

Next, gate electrode 20 is formed on gate insulation 21 over the sloping portion of the heterojunction (i.e. third portion 28) as illustrated by FIG. 5F.

Next, passivation body 36, and field plate 38 can be formed to obtain a device according, for example, the second embodiment or the third embodiment (if an ohmic contact is extended to substrate 6).

For the second and the third embodiments it is also preferred to use Si as a substrate for economic reasons, although other materials such as SiC, GaAs, or Sapphire may be used. Also, it is possible to use a compatible bulk III-nitride material such as, bulk GaN as a material for substrate 6, thereby eliminating the need for a buffer layer.

Furthermore, preferably buffer layer 8 is composed of AlN, base layer 30 is composed of intrinsic or compensated GaN, another buffer layer 32 is composed of preferably GaN to reduce defects generated by the etching, first III-nitride semiconductor body 10 may be composed of undoped InGaN, second III-nitride semiconductor body 12 may be composed of AlGaN, ohmic contact layer 34 may be composed of an N+ III-nitride material such as N+ GaN or AlGaN, gate insulation layer 21 may be composed of $SiO_2$, $Si_3N_4$, diamond, or any other suitable gate insulation, passivation body 36 may be composed of $SiO_2$, $Si_3N_4$, polyamide, or any other appropriate insulating material, and field plate 38 may be composed of any appropriate electrically conducting material, for example, Al, Cu, Au, or other highly conductive material or alloy. First and second ohmic contacts 16, 18 and gate electrode 20 may be composed of any suitable material such as Ti/Al, Ni/Au, Hf, Si, or other Si containing alloys.

Figure 6:
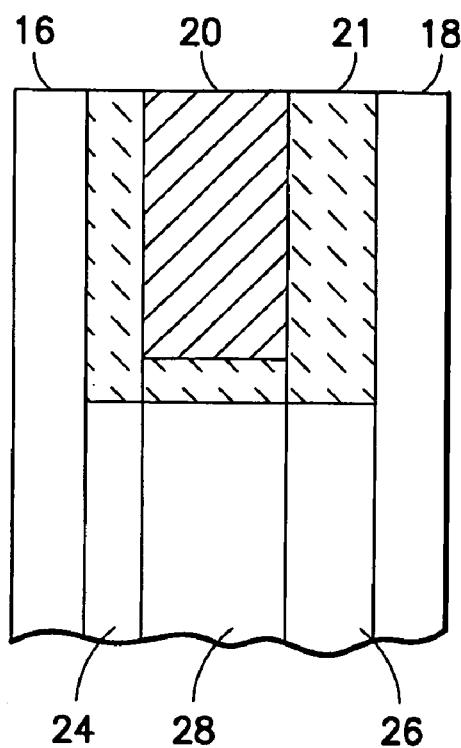
FIG. 6 shows a top plan view of a portion of an active cell of a device according to the present invention.

FIG. 6 shows a top plan view of a portion of an active cell of a device according to the present invention. As seen in FIG. 6, portions of gate electrode 20 and gate insulation 21 are removed to illustrate schematically the sloping third portion 28.

Figure 7:
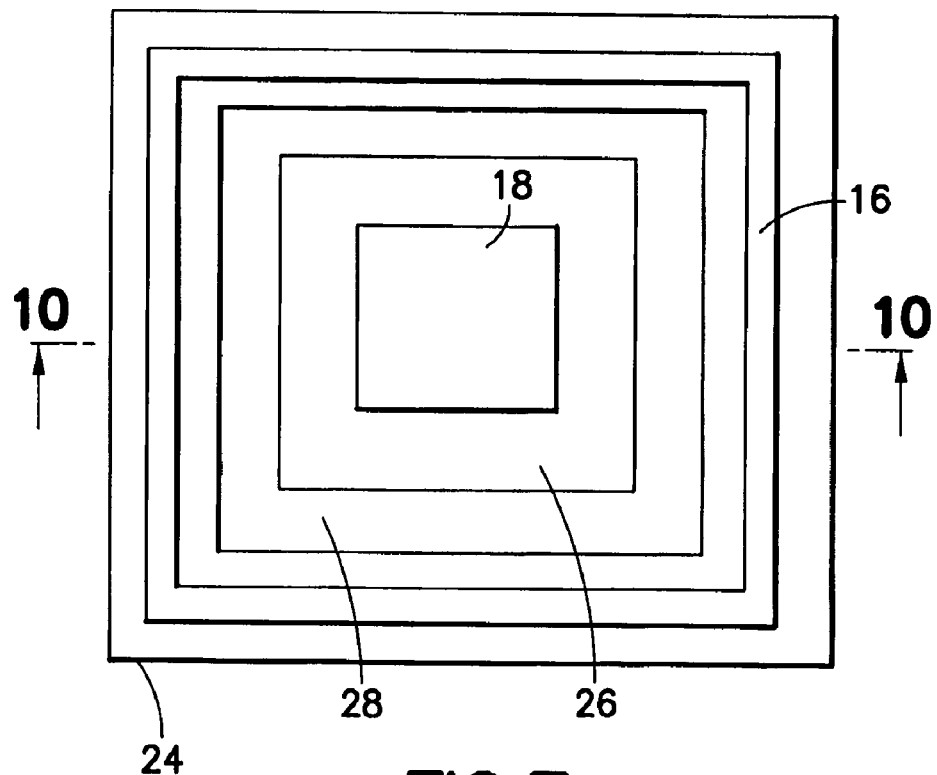
FIG. 7 shows a top plan view of a square active cell (without the gate) in a device according to the present invention.
Figure 8:
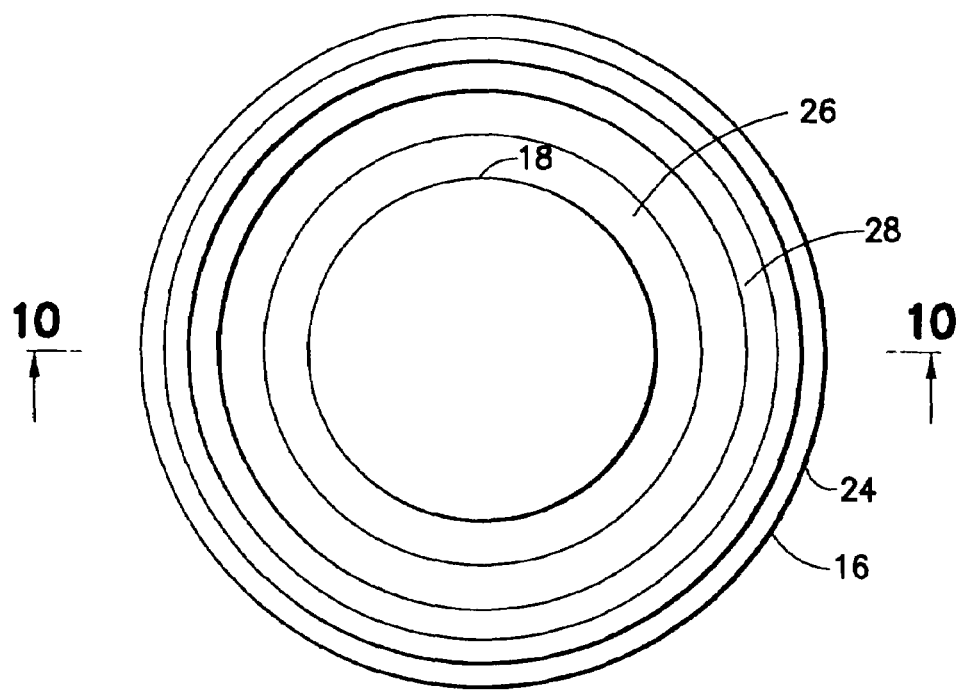
FIG. 8 shows a top plan view of a circular active cell (without the gate) in a device according to the present invention.
Figure 9:
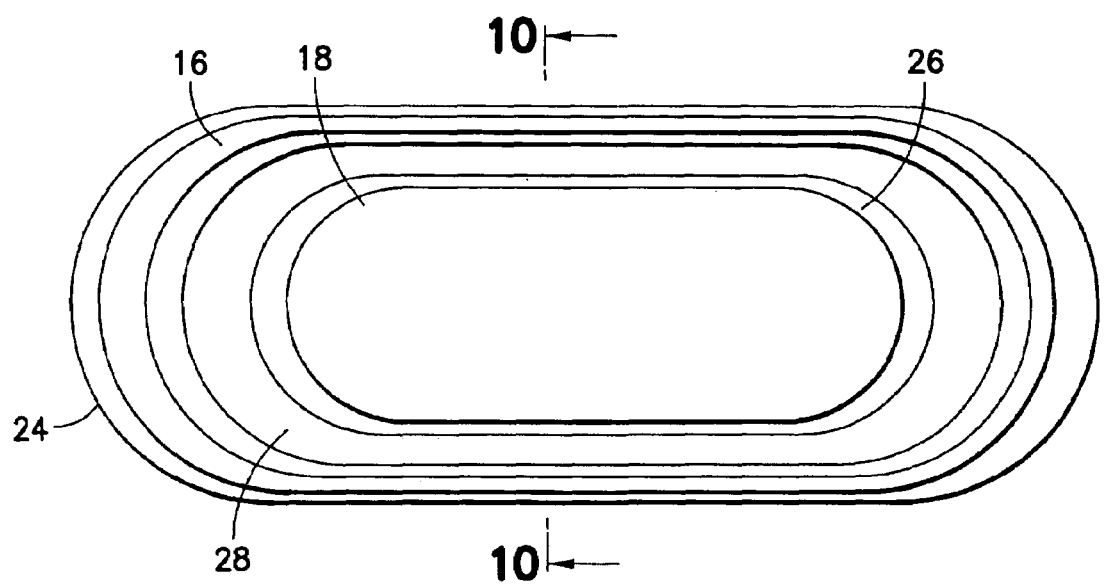
FIG. 9 shows a top plan view of an oval active cell (without the gate) in a device according to the present invention.
Figure 10:
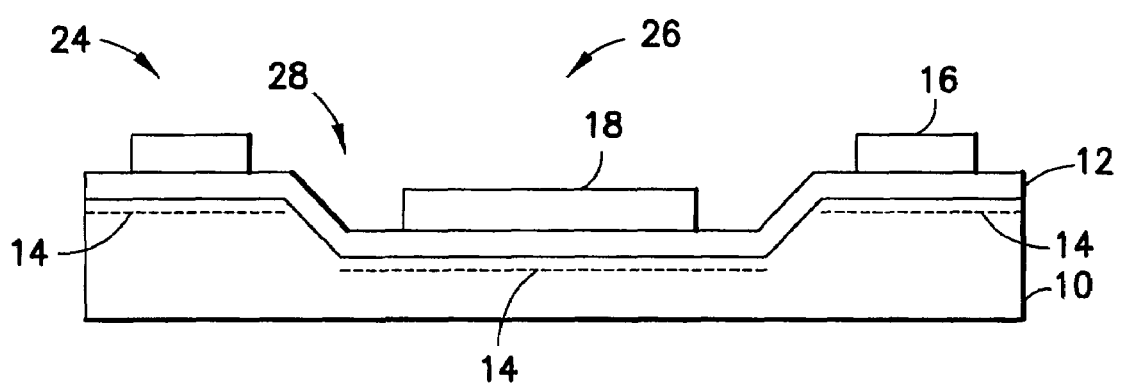
FIG. 10 shows a cross-sectional view of an active cell along line 10-10 in FIGS. 7-9 as seen in the direction of the arrows.

The active cell of a device according to the present invention may be square, as seen in FIG. 7, circular, as seen in FIG. 8, oval, as seen in FIG. 9, or any other shape. Referring to FIG. 7, 8, or 9 (in which gate electrode 20 and gate insulation 21 are removed from view for better illustration) third portion 28 surrounds second portion 26, on which second ohmic electrode 18 is disposed. Thus, as seen in FIG. 10, third portion 28 can form the sidewalls of a depression, while second portion 26 can be the bottom of the depression.

It should be noted that a device according to the present invention can be configured to have a double heterojunction. Thus, according to the fourth embodiment of the present invention, base layer 30 can be composed of AlGaN, buffer layer 32 can be composed of AlGaN, first semiconductor body 10 can be composed of GaN or InGaN, second semiconductor body 12 can be composed of AlGaN (preferably 20-30% Al), contact layer 34 can be an N+ III-nitride semiconductor material, and gate insulation layer may be any suitable gate insulation.

The materials specified herein are preferred, but it should be understood that a device according to the present invention is not restricted to the materials listed herein.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
   a first III-nitride semiconductor body;
   a second III-nitride semiconductor over said first III-nitride semiconductor body forming a heterojunction body, said heterojunction body including a first portion, a second portion non-coplanar relative to said first portion, and a third portion sloping at an angle between said first portion and said second portion;
   a drain contact electrically coupled to said first portion of said heterojunction body;
   a source contact electrically coupled to said second portion of said heterojunction body; and
   a gate structure coupled to said third portion of said heterojunction body.

2. A power semiconductor device according to claim 1, wherein when no voltage is applied to said gate structure, said first portion includes a two dimensional electron gas region, said second portion includes a two dimensional electron gas region, and said third portion does not include a two dimensional electron gas region.

3. A power semiconductor device according to claim 1, wherein said first III-nitride semiconductor body is comprised of GaN, and said second III-nitride semiconductor body is comprised of AlGaN.

4. A power semiconductor device according to claim 1, wherein said first III-nitride semiconductor body is comprised of InGaN, and said second III-nitride semiconductor body is comprised of AlGaN.

5. A power semiconductor device according to claim 1, wherein said first III-nitride semiconductor body is comprised of AlGaN, and said second III-nitride semiconductor body is comprised of GaN.

6. A power semiconductor device according to claim 1, further comprising a III-nitride ohmic contact layer formed over said second III-nitride semiconductor body, wherein said first and second power contacts are ohmically connected to said III-nitride ohmic contact layer.

7. A power semiconductor device according to claim 1, further comprising an insulation layer, wherein said gate structure is disposed on said insulation layer and capacitively coupled to said third portion and said first and second power contacts extend through said insulation layer.

8. A power semiconductor device according to claim 6, further comprising an insulation layer over said III-nitride ohmic contact layer, wherein said gate structure is disposed on said insulation layer and capacitively coupled to said third portion and said first and second power contacts extend through said insulation layer.

9. A power semiconductor device according to claim 1, wherein said heterojunction body is disposed over a stack, said stack including a substrate, a first buffer layer over said substrate, an intrinsic or compensated III-nitride semiconductor body over said first buffer layer and a second buffer layer disposed between said intrinsic or compensated III-nitride semiconductor body and said heterojunction body.

10. A power semiconductor device according to claim 9, wherein at least one of said power contacts extends to at least said substrate.

11. A power semiconductor device according to claim 9, wherein said substrate is comprised of silicon, or SiC, or sapphire, or a bulk III-nitride semiconductor or GaAs.

12. A power semiconductor device according to claim 9, wherein said first buffer layer is comprised of AlN.

13. A power semiconductor device according to claim 1, wherein said first III-nitride semiconductor body is any alloy of AlGaInN, and said second III-nitride body is any alloy of AlGaInN, said alloys being selected to create a two dimensional gas.

14. A power semiconductor device according to claim 1, wherein said third portion is oval, or circular, or square.

15. A power semiconductor device according to claim 1, wherein said device includes a double heterojunction.

16. A power semiconductor device according to claim 15, wherein said double heterojunction includes a third semiconductor body, said first semiconductor body being disposed over said third semiconductor body and said second semiconductor body being disposed over said first semiconductor body.

17. A power semiconductor device according to claim 16, wherein said first semiconductor body is comprised of GaN, or InGaN, and said second and said third semiconductor bodies are comprised of AlGaN.

* * * * *